United States Patent
Zeng

(10) Patent No.: US 10,965,319 B2
(45) Date of Patent: Mar. 30, 2021

(54) BIT FLIPPING ALGORITHM FOR DECODING LDPC-ENCODED DATA

(71) Applicant: PetalO Inc., Santa Clara, CA (US)

(72) Inventor: LingQi Zeng, San Jose, CA (US)

(73) Assignee: PETAIO INC., Santa Clara, CA (US)

( * ) Notice: Subject to any disclaimer, the term of this patent is extended or adjusted under 35 U.S.C. 154(b) by 33 days.

(21) Appl. No.: 16/171,008

(22) Filed: Oct. 25, 2018

(65) Prior Publication Data

US 2020/0136644 A1 Apr. 30, 2020

(51) Int. Cl.
| | |
|---|---|
| H03M 13/00 | (2006.01) |
| H03M 13/11 | (2006.01) |
| G11C 29/52 | (2006.01) |
| G06F 11/10 | (2006.01) |

(52) U.S. Cl.
CPC ..... *H03M 13/1108* (2013.01); *G06F 11/1068* (2013.01); *G11C 29/52* (2013.01); *H03M 13/616* (2013.01)

(58) Field of Classification Search
CPC ............. H03M 13/1108; H03M 13/616; G06F 11/1068; G11C 29/52
See application file for complete search history.

(56) References Cited

U.S. PATENT DOCUMENTS

| | | | | |
|---|---|---|---|---|
| 8,121,200 B2* | 2/2012 | Zheng | ................. | H04L 25/4917 375/238 |
| 8,312,354 B1* | 11/2012 | Varnica | .............. | H03M 13/1105 714/780 |
| 8,413,023 B2* | 4/2013 | Ashe | ................... | G11B 20/1833 714/781 |
| 9,385,753 B2* | 7/2016 | Varnica | .............. | H03M 13/1108 |
| 9,459,956 B2* | 10/2016 | Hubris | ................ | G06F 11/1048 |
| 9,614,547 B2* | 4/2017 | Fainzilber | .......... | H03M 13/1108 |
| 10,148,287 B2* | 12/2018 | Xiong | ................... | G06F 3/0619 |
| 10,218,388 B2* | 2/2019 | Lin | .................... | H03M 13/2963 |
| 10,256,842 B2* | 4/2019 | Kwok | ................. | G06F 11/1076 |

* cited by examiner

*Primary Examiner* — Esaw T Abraham
(74) *Attorney, Agent, or Firm* — David R. Stevens; Stevens Law Group

(57) ABSTRACT

A bit flipping algorithm for an LDPC decoder evaluates a data sequence d with respect to a parity code matrix H. Where one or more checks fail, bits of d are flipped such that for some iterations, the bits are flipped with bias toward and original data sequence r. For example, for some iterations, where the number of failed checks are below a first threshold T1, bits are only permitted to flip back to the value of that bit in the original data sequence r. In such iterations, bits are permitted to flip from the value in the original data sequence r only when the number of failed checks is greater than a second threshold T2, T2>T1. Values for thresholds may be based on a number of flipped bits from a previous iteration and may be calculated using a syndrome s=Hd from a previous iteration.

20 Claims, 8 Drawing Sheets

BIT FLIPPING ALGORITHM FOR DECODING LDPC-ENCODED DATA

BACKGROUND

Field of the Invention

This invention relates to systems and methods for implementing error correction in a solid state drive (SSD).

Background of the Invention

The data storage industry has gone through revolutionary changes since the emergence and maturity of NAND flash technologies. With NAND flash's exceptional performance and low power consumption, it is just a matter of time before NAND flash storage devices will be the choice for every computer and data center. However, one barrier to adoption is the cost. As NAND technologies continue advancing rapidly, the cost of NAND flash storage devices is also going down quickly and becoming more acceptable to consumers and enterprise customers.

While the cost of NAND flash is getting lower, the reliability is also getting lower. Therefore, advanced error correction coding schemes, such as LDPC (low density parity check) codes, are required to be employed in order to guarantee the data reliability as well as improve the usable lifetime of the NAND flash storage devices.

The bit-flipping decoding algorithm was first invented by Gallager in his famous thesis on LDPC Codes more than half century ago (see R. G. Gallager, "Low-Density Parity-Check Codes", in Research Monograph series. Cambridge, MIT Press, 1963, which is hereby incorporated herein by reference in its entirety). The general idea of the bit-flipping decoder is to count the number of unsatisfied syndromes for each data bit and then flip those ones with the maximum number of unsatisfied syndromes. The above process will repeat until all syndromes are satisfied or a predetermined maximum number of iterations is reached. One example implementation of a bit-flipping decoding algorithm is described in U.S. Publication 2016/0197624, which is hereby incorporated herein by reference in its entirety.

It would be an advancement in the art to improve the implementation of LDPC error correction in a NAND flash storage device.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION

Figure 1:
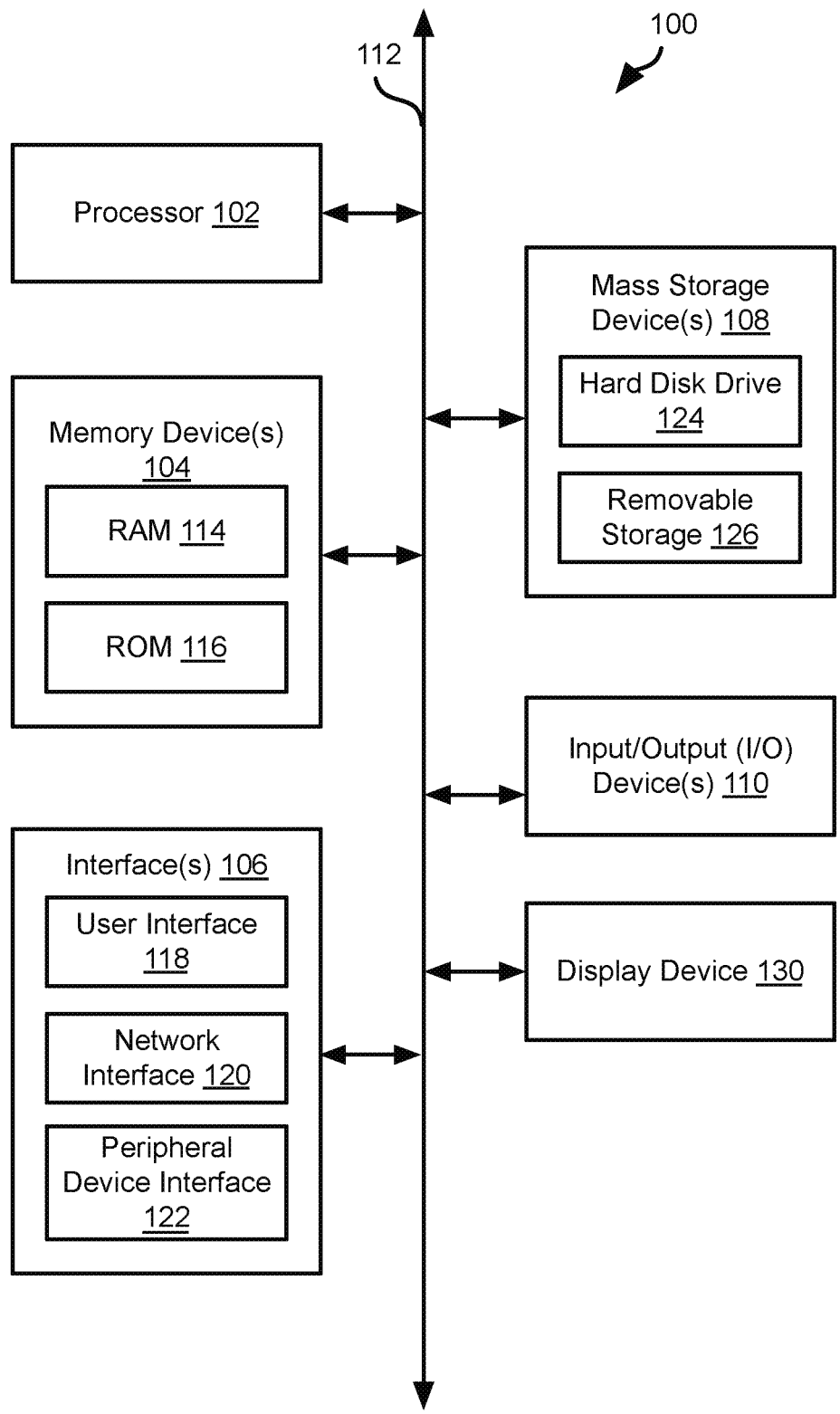
FIG. 1 is a schematic block diagram of a computing system suitable for implementing methods in accordance with embodiments of the invention.

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

The invention has been developed in response to the present state of the art and, in particular, in response to the problems and needs in the art that have not yet been fully solved by currently available apparatus and methods.

Embodiments in accordance with the present invention may be embodied as an apparatus, method, or computer program product. Accordingly, the present invention may take the form of an entirely hardware embodiment, an entirely software embodiment (including firmware, resident software, micro-code, etc.), or an embodiment combining software and hardware aspects that may all generally be referred to herein as a "module" or "system." Furthermore, the present invention may take the form of a computer program product embodied in any tangible medium of expression having computer-usable program code embodied in the medium.

Any combination of one or more computer-usable or computer-readable media may be utilized. For example, a computer-readable medium may include one or more of a portable computer diskette, a hard disk, a random access memory (RAM) device, a read-only memory (ROM) device, an erasable programmable read-only memory (EPROM or flash memory) device, a portable compact disc read-only memory (CDROM), an optical storage device, and a magnetic storage device. In selected embodiments, a computer-readable medium may comprise any non-transitory medium that can contain, store, communicate, propagate, or transport the program for use by or in connection with the instruction execution system, apparatus, or device.

Computer program code for carrying out operations of the present invention may be written in any combination of one or more programming languages, including an object-oriented programming language such as Java, Smalltalk, C++, or the like and conventional procedural programming languages, such as the "C" programming language or similar programming languages. The program code may execute entirely on a computer system as a stand-alone software package, on a stand-alone hardware unit, partly on a remote computer spaced some distance from the computer, or entirely on a remote computer or server. In the latter scenario, the remote computer may be connected to the computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions or code. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a non-transitory computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

FIG. 1 is a block diagram illustrating an example computing device 100. Computing device 100 may be used to perform various procedures, such as those discussed herein. Computing device 100 can function as a server, a client, or any other computing entity. Computing device 100 can be any of a wide variety of computing devices, such as a desktop computer, a notebook computer, a server computer, a handheld computer, tablet computer and the like.

Computing device 100 includes one or more processor(s) 102, one or more memory device(s) 104, one or more interface(s) 106, one or more mass storage device(s) 108, one or more Input/Output (I/O) device(s) 110, and a display device 130 all of which are coupled to a bus 112. Processor(s) 102 include one or more processors or controllers that execute instructions stored in memory device(s) 104 and/or mass storage device(s) 108. Processor(s) 102 may also include various types of computer-readable media, such as cache memory.

Memory device(s) 104 include various computer-readable media, such as volatile memory (e.g., random access memory (RAM) 114) and/or nonvolatile memory (e.g., read-only memory (ROM) 116). memory device(s) 104 may also include rewritable ROM, such as flash memory.

Mass storage device(s) 108 include various computer readable media, such as magnetic tapes, magnetic disks, optical disks, solid-state memory (e.g., flash memory), and so forth. As shown in FIG. 1, a particular mass storage device is a hard disk drive 124. Various drives may also be included in mass storage device(s) 108 to enable reading from and/or writing to the various computer readable media. Mass storage device(s) 108 include removable media 126 and/or non-removable media.

I/O device(s) 110 include various devices that allow data and/or other information to be input to or retrieved from computing device 100. Example I/O device(s) 110 include cursor control devices, keyboards, keypads, microphones, monitors or other display devices, speakers, printers, network interface cards, modems, lenses, CCDs or other image capture devices, and the like.

Display device 130 includes any type of device capable of displaying information to one or more users of computing device 100. Examples of display device 130 include a monitor, display terminal, video projection device, and the like.

interface(s) 106 include various interfaces that allow computing device 100 to interact with other systems, devices, or computing environments. Example interface(s) 106 include any number of different network interfaces 120, such as interfaces to local area networks (LANs), wide area networks (WANs), wireless networks, and the Internet. Other interface(s) include user interface 118 and peripheral device interface 122. The interface(s) 106 may also include one or more user interface elements 118. The interface(s) 106 may also include one or more peripheral interfaces such as interfaces for printers, pointing devices (mice, track pad, etc.), keyboards, and the like.

Bus 112 allows processor(s) 102, memory device(s) 104, interface(s) 106, mass storage device(s) 108, and I/O device(s) 110 to communicate with one another, as well as other devices or components coupled to bus 112. Bus 112 represents one or more of several types of bus structures, such as a system bus, PCI bus, IEEE 1394 bus, USB bus, and so forth.

For purposes of illustration, programs and other executable program components are shown herein as discrete blocks, although it is understood that such programs and components may reside at various times in different storage components of computing device 100, and are executed by processor(s) 102. Alternatively, the systems and procedures described herein can be implemented in hardware, or a combination of hardware, software, and/or firmware. For example, one or more application specific integrated circuits (ASICs) can be programmed to carry out one or more of the systems and procedures described herein.

Figure 2:
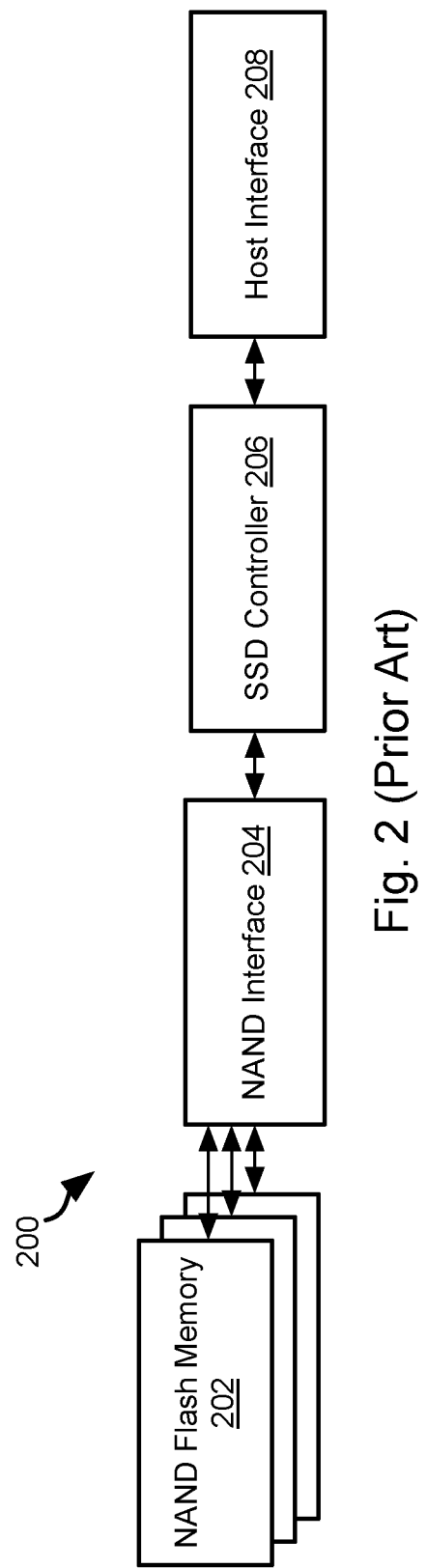
FIG. 2 is a schematic block diagram of components of a storage system in accordance with the prior art.

Referring to FIG. 2, a typically flash storage system 200 includes a solid state drive (SSD) that may include a plurality of NAND flash memory devices 202. One or more NAND devices 202 may interface with a NAND interface 204 that interacts with an SSD controller 206. The SSD controller 206 may receive read and write instructions from a host interface 208 implemented on or for a host device, such as a device including some or all of the attributes of the computing device 100. The host interface 208 may be a data bus, memory controller, or other components of an input/output system of a computing device, such as the computing device 100 of FIG. 1.

The methods described below may be performed by the host, e.g. the host interface 208 alone or in combination with the SSD controller 206. The methods described below may be used in a flash storage system 200, hard disk drive (HDD), or any other type of non-volatile storage device. The methods described herein may be executed by any component in such a storage device or be performed completely or partially by a host processor coupled to the storage device.

The method disclosed herein provide an improved bit-flipping decoding algorithm for implementing LDPC (Low Density Parity Code) error correction. LDPC codes as presented by Gallager received little research attention from either academy or industry until the 1990s. There was a lot of academic research on how to improve bit-flipping decoding but all of these approaches employ soft reliability information obtained from the channel, such as the weighted bit-flipping algorithm and its variations. However, the conventional bit-flipping decoding algorithm with hard inputs only remains the same.

In addition, conventional approaches to LDPC burns a lot more power than the traditional BCH codes and this shortcoming prevents its wide adoption.

In order to overcome the power issue, the embodiments disclosed below provide an enhanced bit-flipping decoding algorithm with only hard inputs. The enhanced algorithm can improve the correction performance and convergence rate, which in turn can improve the read latency of the NAND flash based storage devices.

The embodiments disclosed may include some or all of the following three improvements. First, the embodiments disclosed below improve the algorithm by taking into account the channel inputs when determining whether a bit should be flipped or not. Second, the embodiments below include an adaptable bit-flipping criterion which helps to prevent the decoder from getting trapped. Third, the embodiments below include a heuristic algorithm for determine the flip threshold at each iteration.

Referring to FIG. 3A, the conventional bit-flipping decoding algorithm of an LDPC code is conducted over its underlying parity-check matrix H. Denote r the input data sequence to the bit-flipping decoder and s the syndrome (s=Hr). Let K be the total number of unsatisfied checks, that is, K=sum(s), i.e. the sum of all the elements of the vector s. Similarly, let $K_i$ to be the total number of unsatisfied checks for each column i. Specifically, H is a matrix with M rows and N columns. Accordingly, s will be a vector with N elements. If an element $s_i$ in s is non zero, the value of $K_i$ is the number of ones in column i of H.

Figure 3:
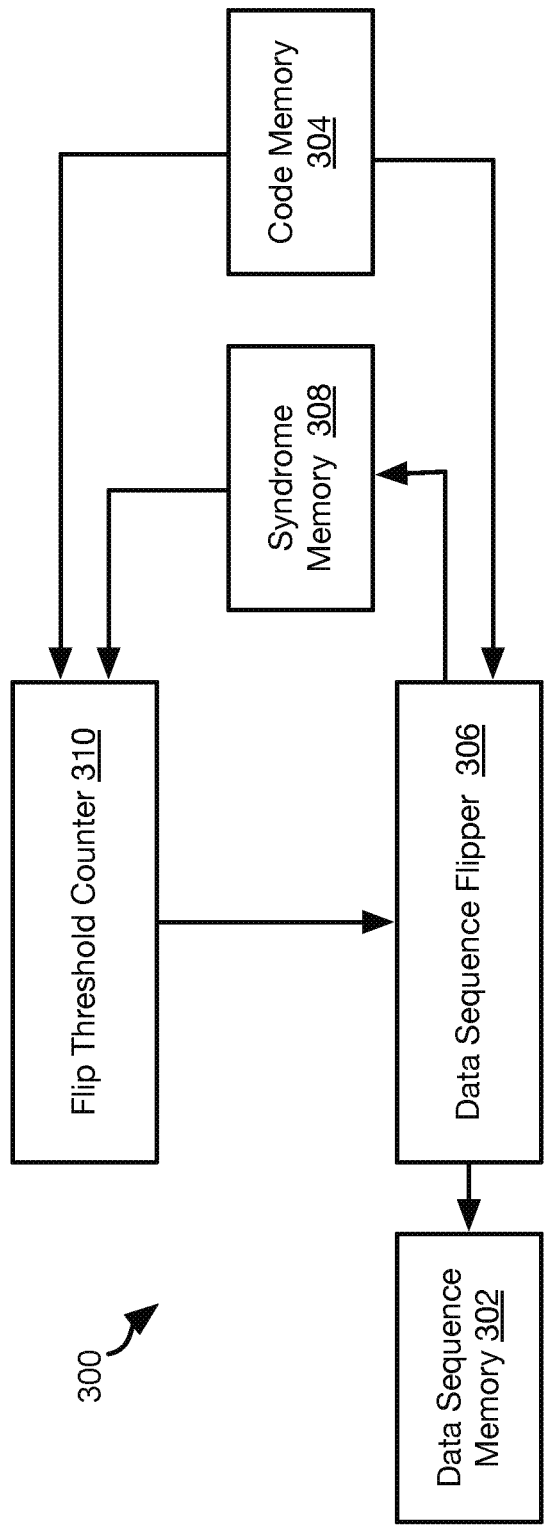
FIG. 3 is a schematic block diagram of components for performing a bit-flipping decoding algorithm for an LDPC code in accordance with the prior art.

A conventional bit-flipping decoding algorithm may be understood with respect to the diagram of FIG. 3 and includes the following steps:

1) Initialize t=0
2) $r^{(t)}$=r
3) Compute $s^{(t)}=Hr^{(t)}$. If $s^{(t)}$. If $s^{(t)}$ has all zero values, then there are no unsatisfied checks and the method ends.
4) Based on $s^{(t)}$, compute $K_i^{(t)}$ for each column i and record $$T = \max_{0 \le i < n} K_i^{(t)},$$

where n is the LDPC code length.

5) Flip all the bits at each position i in $r^{(t)}$ such that $K_i^{(t)}$=T.
6) Set t=t+1, and go to step 2) unless t reaches a predetermined number I.

FIG. 3 illustrates a system 300 that may be used to implement the conventional bit-flipping decoding algorithm. For example, data sequence memory 302 stores the value of $r^{(t)}$, which is the original value initially, which is then modified as discussed above. Code memory 304 stores the parity-check matrix H.

Data sequence flipper 306 calculates the syndrome s which is stored in syndrome memory 308. Flip threshold counter 310 calculates the values of $K_i$ and T. Data sequence flipper 306 then retrieves r from data sequence memory 302 and flips zero or more bits of $r^{(t)}$ according to $K_i$ and T. The data sequence flipper 306 then stores the new value of $r^{(t)}$ in the data sequence memory 302.

One of the shortcomings of the prior approach is that the conventional bit-flipping decoding algorithm doesn't take into account the fact that the inputs are more likely correct than wrong. The decoder usually works at a very low raw BER (bit error rate) region, generally under $1\times10^{-2}$. That is, every bit has at least a 99% chance of being correct. The embodiments described below provide a very cost-effective way to employ the input bits as part of the decoding algorithm.

Another shortcoming of the conventional bit-flipping decoder is that it will take long time to compute $$T = \max_{0 \le i < n} K_i^{(t)},$$

which substantially degrades the latency performance. The embodiments disclosed below significantly reduce the decoding time with negligible performance impact.

First we introduce the notation $d^{(t)}$ as the current decision after iteration t in place of $r^{(t)}$ and keep r unchanged as the input data bits. Instead of simply flipping all the bits with the number of unsatisfied checks equal to the maximum number T as shown in the previous step 5) for the conventional bit-flipping decoder, flipping is biased in favor of the input bits r.

Figure 4A:
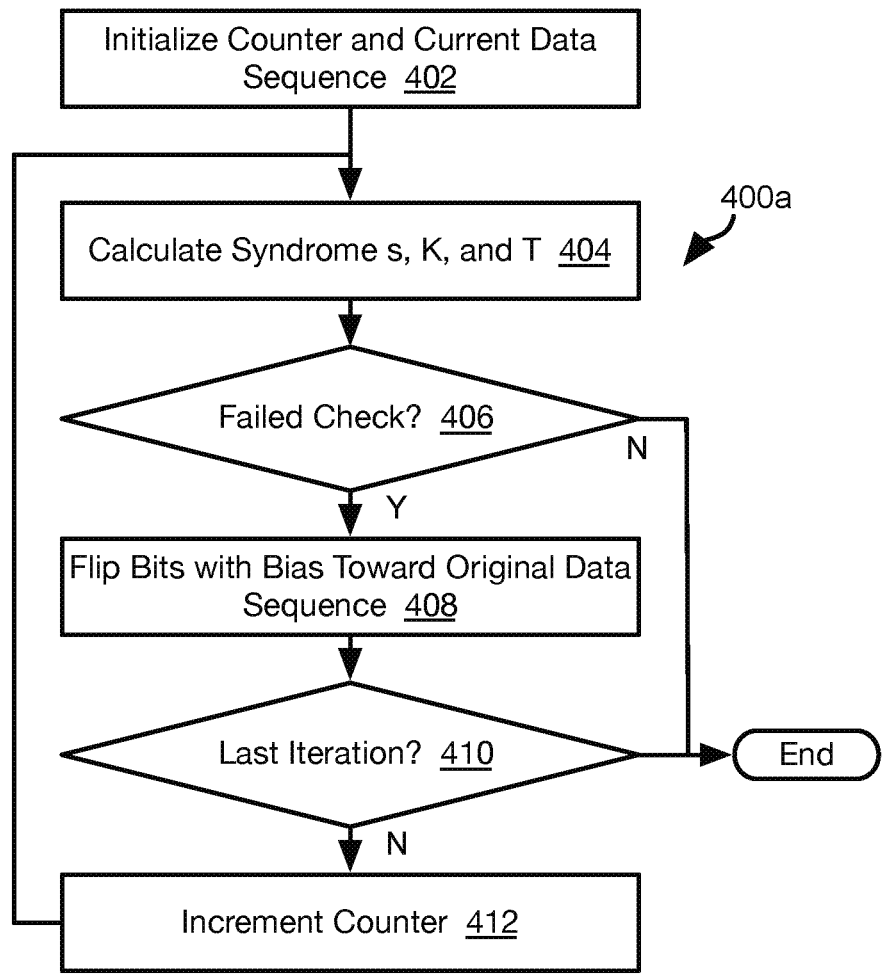
FIG. 4A is a process flow diagram of a method for performing a bit-flipping decoding algorithm in accordance with an embodiment of the present invention.

FIG. 4A illustrates an example method 400a for implementing biased bit flipping. The method 400a may include initializing 402 an iteration counter (t=0) and initializing the current data sequence $d^{(t)}$=r. The method 400a may then include calculating 404 the syndrome $s^{(t)}=Hd^{(t)}$.

If $s^{(t)}$ indicates 406 one or more failed checks, the method 400a may then include flipping 408 one or more bits of $d^{(t)}$ with a bias toward the original bits. If there are no failed checks, the method 400a ends.

Step 408 may include flipping the bit at position i in $d^{(t)}$ if, for the corresponding column i, $K_i^{(t)}$>=T and $d_i^{(t)}$!=$r_i^{(t)}$. In this way, the method penalizes those bits that flip to a polarity different from the original input bits by delaying its chance of flipping. In other words, the method 400a encourages those bits that tend to flip themselves to be the same sign as the original input bits and give the other bits a second chance to reconsider whether they should be flipped or not.

In some embodiments, the biased flipping of step 408 may be refined by flipping the bit at position i in $d^{(t)}$ where the corresponding value of $K_i^{(t)}$ meets one of the following conditions: 1) $K_i^{(t)}$>=$T_1$ and $d_i^{(t)}$!=$r_i^{(t)}$; or 2) $K_i^{(t)}$>=$T_2$ and $d_i^{(t)}$==$r_i^{(t)}$, where $T_1$<$T_2$ in some embodiments. Accordingly, only where the number of failed checks for column i meets the larger threshold $T_2$ will bit i of $d_i^{(t)}$ be permitted to flip from its original value. $T_1$ and $T_2$ may be a function of T or be static thresholds. For example, one of $T_1$ and $T_2$ may be equal to T as defined above.

In the dual-threshold approach, different flipping thresholds control whether a bit will flip to the original input bit value or not. The larger the difference between $T_1$ and $T_2$, the more favor is given to flipping bits back to the original data bit value.

The method 400a may include evaluating 410 whether the current iteration t is the last iteration, e.g. t==I. If so, the method 400a ends. Where unsatisfied checks remain for the latest value of $d^{(t)}$, this may indicate that an unresolvable error exists and therefore the retransmission of the data sequence r may be requested. Where no unsatisfied checks remain, the latest value for $d^{(t)}$ may be used as the decoded data sequence.

If the current iteration 410 is not found to be the last iteration, t is incremented 412 and processing continues at step 404.

Figure 4B:
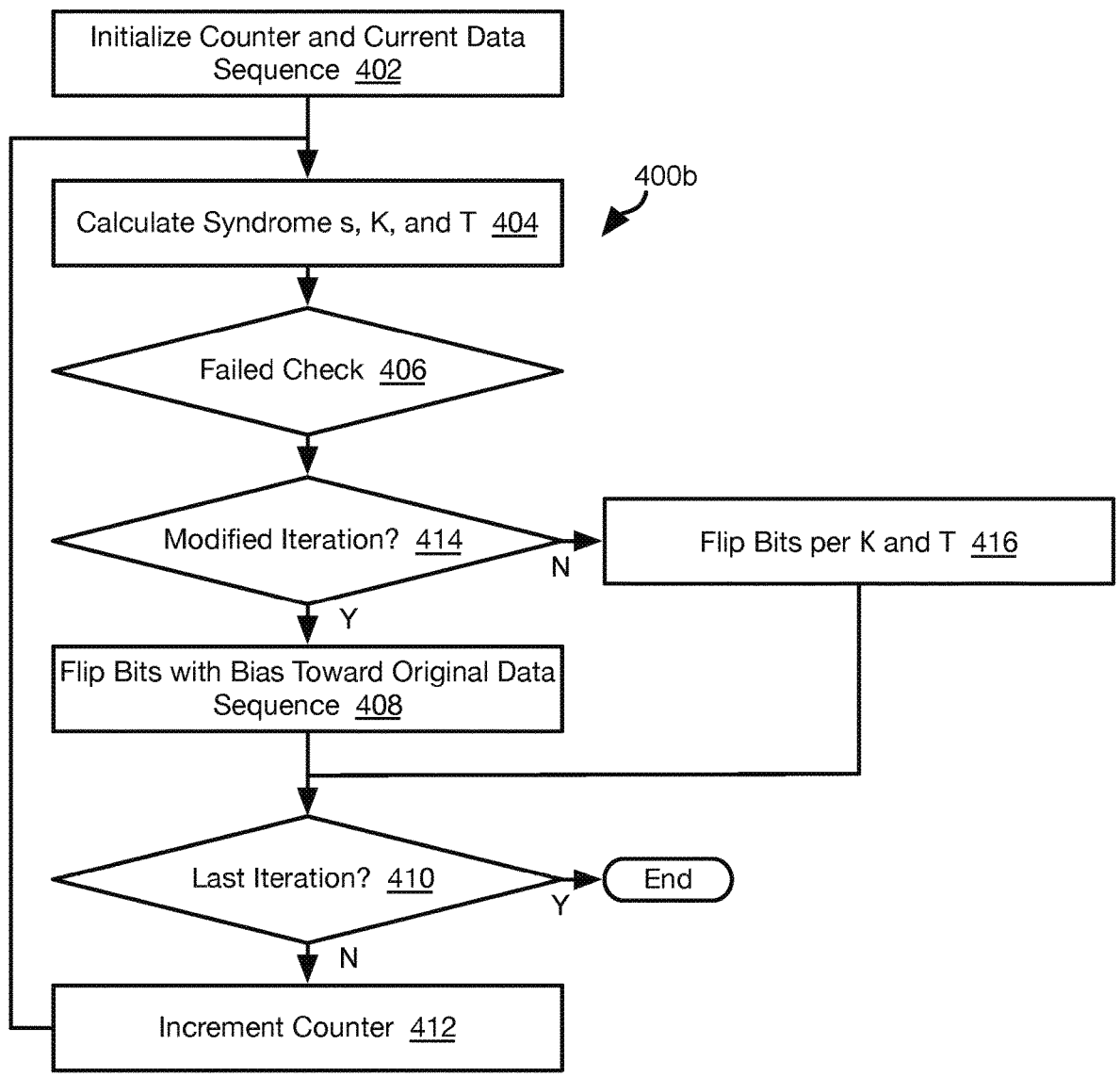
FIG. 4B is a process flow diagram of another method for performing a bit-flipping decoding algorithm in accordance with an embodiment of the present invention.

Referring to FIG. 4B, when using a bit-flipping decoder, one concern is that the decoder sometime gets trapped and will oscillate between a few fixed patterns. For example, the bit-flipping decoder may repeatedly flip the bits at certain fixed locations between iterations without being able to satisfying all the syndromes. To break such patterns, the improved method 400b may be used.

The method 400 may include performing steps 402-406 as described with respect to the method 400a.

However, the method 400 may include evaluating 414 the current value of the iteration counter t to determine whether the current iteration should be modified. For example, some iterations may be unmodified such that whether bits are flipped and which bits are flipped 416 are determined according to the conventional approach (step 5, above: flip all the bits at each postion i in $d^{(t)}$ such that $K_i^{(t)}$==T).

If the current iteration is found 414 to be a modified iteration, then bits are flipped 408 as described above with respect to step 408 of the method 400a. This may include either of the approaches described above. In particular, step 408 of the method 400b may include either of:

flipping the bit at position i in $d^{(t)}$ if, for the corresponding column i, $K_i^{(t)}$>=T and $d_i^{(t)}$!=$r_i^{(t)}$; and flipping the bit at position i in $d_i^{(t)}$ if, for the corresponding column i, $K_i^{(t)}$ meets one of the following conditions: 1) $K_i^{(t)}$>=$T_1$ and $d_i^{(t)}$!=$r_i^{(t)}$; or 2) $K_i^{(t)}$>=$T_2$ and $d_i^{(t)}$==$r_i^{(t)}$, where $T_1$<$T_2$ Which iterations are modified may be a function of t. For example, every M iterations, where M is a predefined integer greater than or equal to two, may be a modified iteration such that a first iteration is constrained to be unmodified. In another approach, the function used to determine whether an iteration of t is modified may be non-periodic. For example, the function may be such that a frequency of modified iterations increases with increasing value of t. In some embodiments, modified iterations are only performed according to any of the above-described functions of t when t is greater than a threshold value, e.g. a value greater than or equal to ½. In some embodiments, iterations of t that are modified may be selected according to a random (e.g., pseudo random) function.

In some embodiments, whether an iteration is modified or unmodified is more dynamic and depends on the decoding process. For example, let $f^{(t)}$ denote the number of the flipped bits at each iteration t. Hence we can compare the number of the flipped bits between two consecutive iterations. If they are the same, then oscillation may have occurred and the flipping criterion will be switched for the following iteration, i.e., changed from modified to unmodified or changed from unmodified to modified. After switching, one can continue the current flipping criterion until the next oscillation is detected or switch right back to the previous criterion after one or some fixed number of iterations. In some cases, whether an iteration is modified can be dynamically determined by a threshold expectation calculation algorithm described below with respect to FIG. 6. Note the proposed schemes provides a cost-effective way to achieve better correction capability by simply controlling the flipping criterion without having to introducing any soft/reliability values and thus keep the design very efficient.

After step 408 or 416, the method 400b may include performing steps 410 and 412 as described above with respect to the method 400a.

Figure 5:
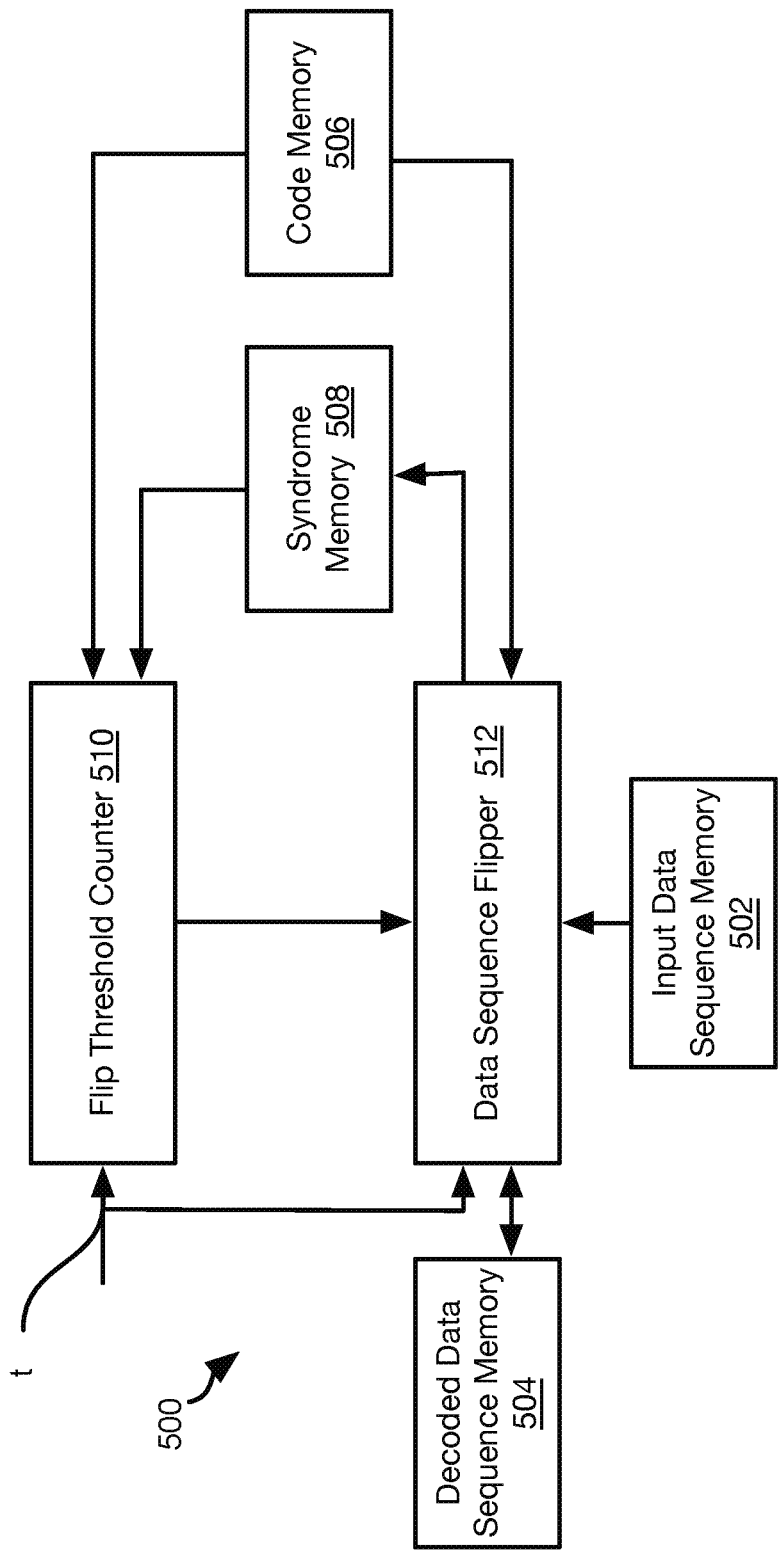
FIG. 5 is a schematic block diagram of components for implementing a bit-flipping decoding algorithm for an LDPC code in accordance with the method of FIGS. 4A and 4B.

FIG. 5 illustrates a system 500 that may be used to implement the methods 400a and 400b. The system 500 may include an input data sequence memory 502 that stores the original data sequence r and a decoded data sequence memory 504 that stores the current value of $d^{(t)}$. Code memory 506 stores the matrix H and syndrome memory 508 stores the current value of the syndrome s.

Flip threshold counter 510 takes as inputs the current iteration t, the syndrome s and matrix H and provides thresholds T, $T_1$, and $T_2$ and the vector $K_1^{(t)}$ to a data sequence flipper 512. The data sequence flipper 512 then determines which bits to flip based on the thresholds T, $T_1$, and $T_2$ and the vector $K_i^{(t)}$ as described above with respect to the method 400a or 400b.

Figure 6:
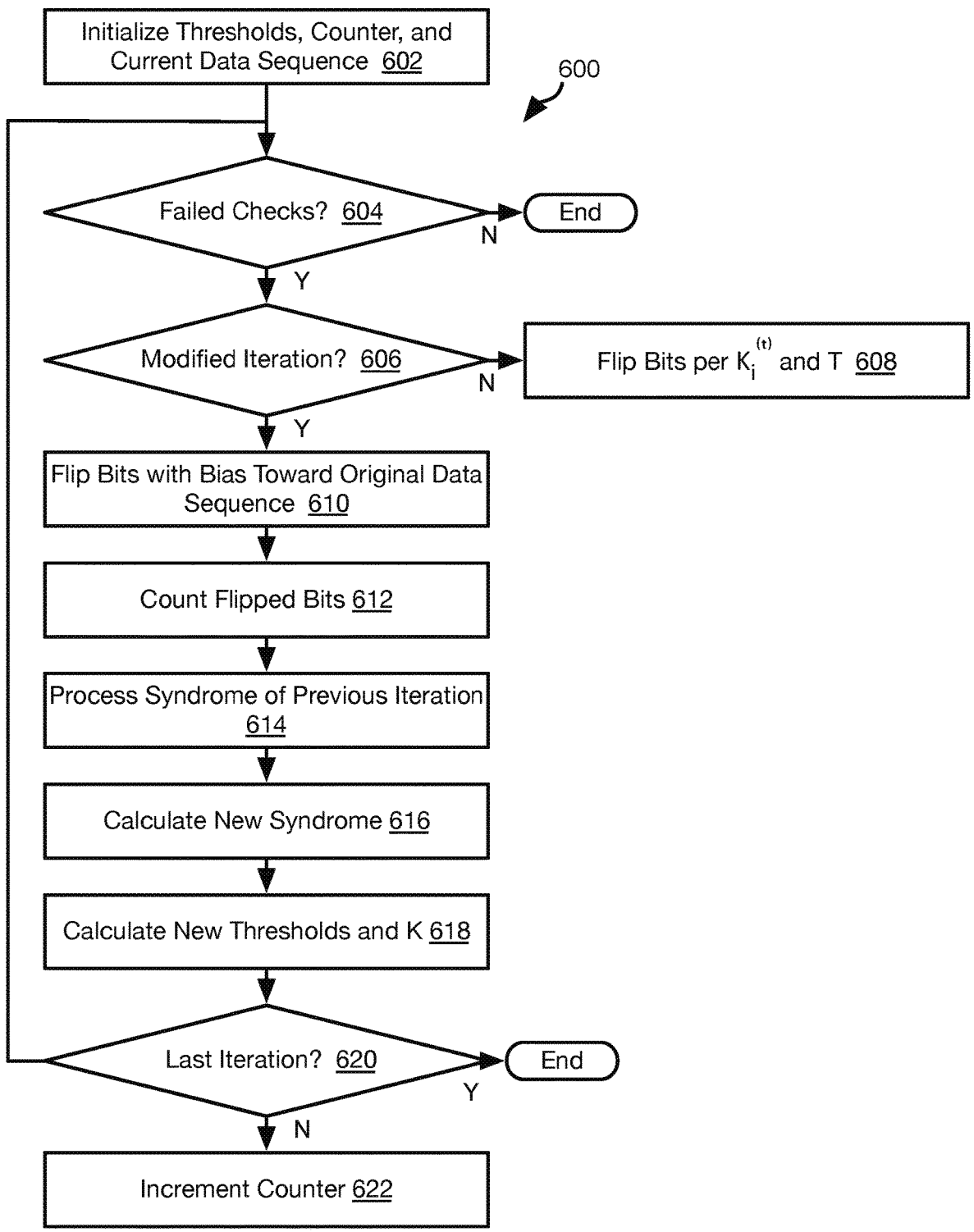
FIG. 6 is a process flow diagram of another method for performing a bit-flipping decoding algorithm in accordance with an embodiment of the present invention.

Referring to FIG. 6, the conventional bit-flipping decoder takes a long time to identify the flipping threshold T. In addition, with the different flipping thresholds used in the approach of FIGS. 4A and 4B, additional time may be required to evaluate the current data sequence with respect to the input data bits. Determining the thresholds is helpful in order to avoid stuck patterns.

In view of the foregoing, the method 600 of FIG. 6 may be used to reduce processing time and avoid trapping.

The method 600 may include initializing 602 thresholds, a counter, and the current data sequence. For example, an iteration counter may be set t=0, the current data sequence $d^{(t)}$=r, and T=$T_1$=$T_2$=Inf, i.e. a largest possible value representable with the number of bits representing T, T1, and T2 or setting the floating point values representing T, T1, and T2 to the bit values representing positive infinity.

The method 600 may include evaluating 604 whether the current data sequence $d^{(t)}$ fails any checks. This may include calculating whether the syndrome $s^{(t)}$=$Hd^{(t)}$ has any non-zero values. If not, then bit flipping is not needed and the method 600 ends. As discussed below, If there is at least one failed check, the method 600 may include evaluating 606 whether the current iteration is a modified iteration, denoted herein as "tt." If not, the unmodified, i.e., conventional, bit flipping approach is performed at step 608 (see step 416 of the method 400b described above). Whether the iteration is a modified iteration may be determined in the same manner as step 414 of the method 400b.

If the current iteration is not a modified iteration, then $K_i^{(t)}$ and T may be calculated based on $s^{(t)}$ and bits flipped 608 in the conventional manner (see steps 4 and 5 of the conventional approach described above). In some embodiments, latency is reduced by calculating T and $K_i^{(t)}$ using the syndrome $s^{(t-1)}$ of a previous iteration for both modified and unmodified iterations. In this manner, the calculation of T and $K_i^{(t)}$ may be performed in parallel with calculating of $s^{(t)}$.

If the current iteration is found 606 to be a modified iteration tt, the method may include flipping 610 bits in $d^{(t)}$ with bias toward the original data sequence r. In particular, this may include flipping the bits according to the approach described for step 408 of the method 400b: for each bit position i in $d_i^{(t)}$, flip the value $d_i^{(t)}$ if (1) $K_i^{(t)} >= T_1$ and $d_i^{(t)} != r_i^{(t)}$; or (2) $K_i^{(t)} >= T_2$ and $d_i^{(t)} == r_i^{(t)}$, where $T_1 < T_2$ in some embodiments.

The method 600 may further include counting 612 a number $f^{(t)}$ of bits in $d_i^{(t)}$ that were flipped at step 610. The syndrome $s^{(t-1)}$ of the previous iteration t–1 may also be processed 614 to calculate values for use in determining thresholds for the next iteration. For example, a value $T_a$ may be calculated as $T_a = \max_{0 <= i < n}(K_i^{(t)})$, where n is the number of values in $s^{(t-1)}$ and $K_i^{(t)}$ is calculated based on $s^{(t-1)}$. The manner in which $T_a$ is used is described below with respect to Algorithm 1.

In some embodiments, steps 610, 612, and 614 are all performed in parallel. In particular, each of these steps includes looping through all of the columns of the matrix H and therefore may be performed simultaneously in order to require looping through all of the columns of the matrix H a single time.

The method 600 may further include calculating 616 a new syndrome $s^{(t)} = Hd^{(t)}$ for the current data sequence $d^{(t)}$ as modified by the flipping step 610. The method 600 may then include calculating 618 $K_i^{(t+1)}$ according to $s^{(t)}$ for the next iteration. Step 618 may further include calculating one or more thresholds, such as thresholds T, $T_1$, and $T_2$ for the next iteration. To reduce latency, the thresholds T, $T_1$, and $T_2$ may be calculated based on $s^{(t)}$, i.e. not $s^{(t+1)}$ as calculated at step 618. In this manner, calculating $K_i^{(t+1)}$ and T, $T_1$, and $T_2$ may be performed in parallel. In some embodiments, $s^{(t)}$ will be used in iteration t+1 at step 604 to evaluate whether there are any failed checks. Inasmuch as $s^{(t)}$ is calculated at step 616, some embodiments will not flip any bits in a first iteration. In a subsequent iteration, $s^{(t-1)}$ from the previous iteration may be evaluated at step 604. Accordingly, it takes at least two iterations before bits are flipped in some embodiments.

The thresholds T, $T_1$, and $T_2$ may be calculated at step 618 according to Algorithm 1, below. One benefit of Algorithm 1 is that thresholds used in an iteration are either based on static values (g) or based only on $f^{(t)}$ or $T_a$ from a previous iteration thereby reducing latency.

If t is found 620 to be equal to the maximum number of iterations I, then the method 600 ends. Otherwise, t is incremented 622 and the method continues at step 604.

---

Algorithm 1

---

At iteration t:
IF K <= g
  T = K and force tt not including t+1
ELSE
  IF t == 0
    T = g and force tt not including t+1
  ELSE
    IF $f^{(t)}$ == 0
      $T^{(t)} = T_2^{(t)} = T_a$, $T_1^{(t)} = T_2^{(t)} - e$,
    ELSE IF $T^{(t-1)} < T_b$ and/or $f^{(t)} > A$
      $T^{(t)} = T_2^{(t)} = g$, $T_1^{(t)} = T_2^{(t)} - e$,
    ELSE
      $T^{(t)} = T_2^{(t)} = T_C$, $T_1^{(t)} = T_2^{(t)} - e$, or
      $T^{(t)} = T^{(t-1)}$, $T_2^{(t)} = T_2^{(t-1)}$, $T_1^{(t)} = T_1^{(t-1)}$
    END
  END
END

---

K: total number of unsatisfied checks in $s^{(t-1)}$
g: a programmable value that indicates a maximum column weight (in general g becomes smaller as H becomes sparser)
e: a programmable value to reflect the how much more weight to put on the input data bits r
A: a programmable value to reflect if too much bits are flipped at once
$T_b$: a programmable value to reflect the threshold is too small
$T_C$: a predetermined value (typically smaller than g)
force tt not including t+1: the next iteration (t+2) will be a modified iteration tt.

Algorithm 1 provides an approach for determining a threshold by deducing an expected number for each threshold based on side information other than $K_i^{(t)}$ in most instances. The next iteration will just use these thresholds as the flipping criterion. In the meantime, $T_a$ is calculated based on $K_i^{(t)}$. However, $T_a$ is used only when the expectation of the thresholds is too low and cause no flipping bits. In this case, $T_a$ is used in iteration after it is calculated, thereby reducing latency. The side information includes the number of flipped bits $f^{(t)}$, the total number of unsatisfied checks K, the iteration index t and tt, and thresholds $T^{(t)}$, $T_1^{(t)}$ and $T_2^{(t)}$ calculated based on the previous iteration, the maximum column weight g of the matrix, and other static values. Below are some principals embodied by Algorithm 1:

A) When the number of unsatisfied checks K is no larger than the maximum column weight g, then one should force tt to not include the next iteration t+1 and set $T^{(t+1)} = K$.

B) In some embodiments, iteration t=1 is forced to never be an iteration tt because $d^{(1)} = r$ for all columns. Also unless the condition of A) is met, $T^{(1)}$ is set to g in some embodiments.

To summarize, the approaches described herein employ the input data bits in the bit-flipping decoding process. They provide very cost-effective enhancement to the correction capability by employing the input data bits. In some case, dynamic scheme to use the input data bits can help to break the oscillating error patterns. We also propose an algorithm to compute the expectation of the flipping threshold of the bit-flipping decoder. The algorithm will correct itself if the expectation is too large or too small. Overall, with all these enhancement, the proposed bit-flipping decoding algorithm shows better correction performance within a shorter decoding time.

Figure 7:
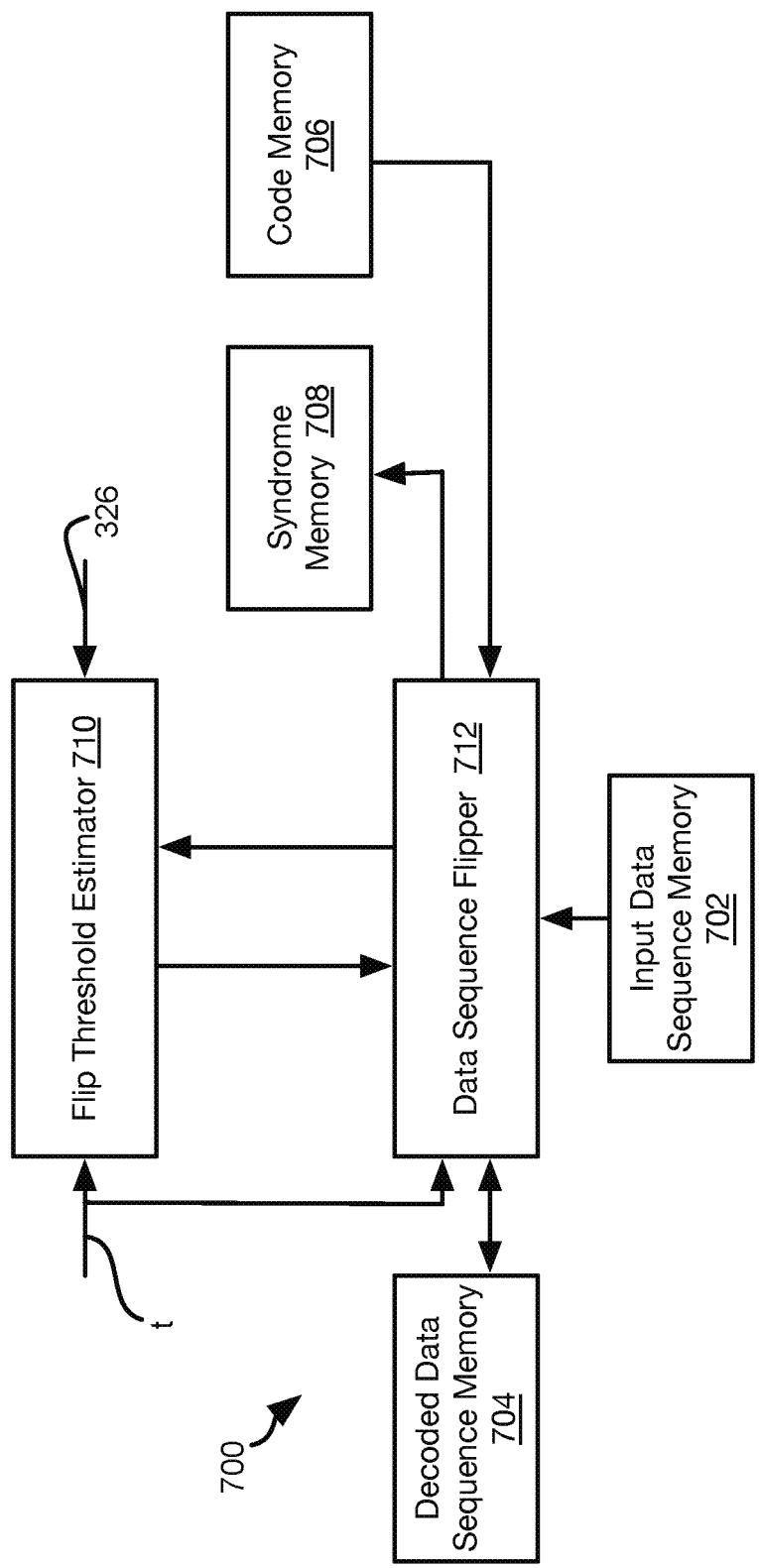
FIG. 7 is a schematic block diagram of components for implementing a bit-flipping decoding algorithm for an LDPC code in accordance with the method of FIG. 6.

FIG. 7 illustrates a system 700 that may be used to implement the method 600. The system 700 may include an input data sequence memory 702 that stores the original data sequence r and a decoded data sequence memory 704 that stores the current value of $d^{(t)}$. Code memory 706 stores the matrix H and syndrome memory 708 stores the current value of the syndrome $s^{(t)}$.

Flip threshold estimator 710 takes as inputs the current iteration t, the $K^{(t)}$, $f^{(t)}$, and the maximum column weight g and provides thresholds T, $T_1$, and $T_2$ to a data sequence flipper 712. The flip threshold estimator may execute Algorithm 1. The data sequence flipper 712 then determines which bits to flip based on the thresholds T, $T_1$, and $T_2$ and the vector $K_i^{(t)}$ as described above with respect to the method 600 (see step 610).

The present invention may be embodied in other specific forms without departing from its spirit or essential characteristics. The described embodiments are to be considered in all respects only as illustrative, and not restrictive. In particular, although the methods are described with respect to a NAND flash SSD, other SSD devices or non-volatile storage devices such as hard disk drives may also benefit from the methods disclosed herein. The scope of the invention is, therefore, indicated by the appended claims, rather than by the foregoing description. All changes which come within the meaning and range of equivalency of the claims are to be embraced within their scope.

The invention claimed is:

1. A method comprising, by a computing device:
    receiving an original data sequence r;
    setting a current data sequence d to be the original data sequence;

performing a plurality of iterations, each iteration of the plurality of iterations including:
(a) evaluating d according to a low density parity code matrix H;
(b) when (a) indicates one or more failed checks according to H, flipping one or more bits in d such that for first iterations of the plurality of iterations one or more bits in d are flipped with biasing toward the original data sequence r; and
(c) repeating (a) and (b) until at least one of (i) (a) indicates there are no failed checks in d and (ii) a number of times (a) and (b) have been performed meets a predefined threshold.

2. The method of claim 1, further comprising defining a threshold T1 and a threshold $T_2$, $T_1<T_2$, wherein:
(a) comprises:
calculating a syndrome s=Hd; and
for each value $s_i$ in s, set a value $K_i$ in a vector K equal to a number of ones in column i of H if $s_i$ is nonzero;
(b) for each first iteration of the first iterations comprises performing:
flipping a bit $d_i$ in d when $K_i>=T_1$ and $d_i!=r_i$; and
flipping a bit $d_i$ in d when $K_i>=T_2$ and $d_i==r_i$.

3. The method of claim 1, further comprising defining a threshold T1 and a threshold $T_2$, $T_1<T_2$;
performing (a) for each iteration of the plurality of iterations by:
calculating a syndrome s=Hd; and
for each value $s_i$ in s, set a value $K_i$ in a vector K equal to a number of ones in column i of H if $s_i$ is nonzero;
performing (b) for each first iteration of the first iterations comprises:
flipping a bit $d_i$ in d when $K_i>=T_1$ and $d_i!=r_i$; and
flipping a bit $d_i$ in d when $K_i>=T_2$ and $d_i==r_i$;
performing (b) for each second iteration of second iterations of the plurality of iterations comprises:
calculating a threshold T=max(K); and
flipping each bit $d_i$ in d in which $K_i>=T$.

4. The method of claim 3, further comprising performing the first iterations interleaved with the second iterations.

5. The method of claim 4, further comprising interleaving the first iterations with the second iterations such that a frequency of occurrence of the first iterations increases with later iterations of the plurality of iterations.

6. The method of claim 5, wherein the first iterations occur only in a later half of the plurality of iterations.

7. The method of claim 3, wherein $T_1$ and $T_2$ for each first iteration are a function of K from a preceding iteration of the plurality of iterations.

8. The method of claim 3, wherein $T_1$ and $T_2$ for each first iteration of the first iterations are a function of s from an iteration of the plurality of iterations that preceded the each first iteration.

9. The method of claim 3, wherein $T_1$ and $T_2$ for each first iteration of the first iterations are a function of a number of bits flipped in an iteration of the plurality of iterations that preceded the each first iteration.

10. The method of claim 3, wherein T1 and T2 are a function of only predefined static values for one or more iterations of the first iterations.

11. A system comprising:
a memory;
a controller programmed to:
receive an original data sequence r;
store r in the memory
set a current data sequence d to be the original data sequence in the memory;
perform a plurality of iterations, each iteration of the plurality of iterations including:
(a) evaluating d according to a low density parity code matrix H;
(b) when (a) indicates one or more failed checks according to H, flipping one or more bits in d such that for first iterations of the plurality of iterations one or more bits in d are flipped with biasing toward the original data sequence r; and
(c) repeating (a) and (b) until at least one of (i) (a) indicates there are no failed checks in d and (ii) a number of times (a) and (b) have been performed meets a predefined threshold.

12. The system of claim 11, wherein the controller is further programmed to:
define a threshold T1 and a threshold $T_2$, $T_1<T_2$, wherein:
perform (a) by:
calculating a syndrome s=Hd; and
for each value $s_i$ in s, set a value $K_i$ in a vector K equal to a number of ones in column i of H if $s_i$ is nonzero;
perform (b) for each first iteration of the first iterations by:
flipping a bit $d_i$ in d when $K_i>=T_1$ and $d_i!=r_i$; and
flipping a bit $d_i$ in d when $K_i>=T_2$ and $d_i==r_i$.

13. The system of claim 11, wherein the controller is further programmed to:
define a threshold T1 and a threshold $T_2$, $T_1<T_2$;
perform (a) for each iteration of the plurality of iterations by:
calculating a syndrome s=Hd; and
for each value $s_i$ in s, set a value $K_i$ in a vector K equal to a number of ones in column i of H if $s_i$ is nonzero;
perform (b) for each first iteration of the first iterations by:
flipping a bit $d_i$ in d when $K_i>=T_1$ and $d_i!=r_i$; and
flipping a bit $d_i$ in d when $K_i>=T_2$ and $d_i==r_i$;
perform (b) for each second iteration of second iterations of the plurality of iterations by:
calculating a threshold T=max(K); and
flipping each bit $d_i$ in d in which $K_i>=T$.

14. The system of claim 13, wherein the controller is further programmed to perform the first iterations interleaved with the second iterations.

15. The system of claim 14, wherein the controller is further programmed to interleave the first iterations with the second iterations such that a frequency of occurrence of the first iterations increases with later iterations of the plurality of iterations.

16. The system of claim 15, wherein the controller is further programmed to cause the first iterations to occur only in a later half of the plurality of iterations.

17. The system of claim 13, wherein $T_1$ and $T_2$ for each first iteration are a function of K from a preceding iteration of the plurality of iterations.

18. The system of claim 13, wherein $T_1$ and $T_2$ for each first iteration of the first iterations are a function of s from an iteration of the plurality of iterations that preceded the each first iteration.

19. The system of claim 13, wherein $T_1$ and $T_2$ for each first iteration of the first iterations are a function of a number of bits flipped in an iteration of the plurality of iterations that preceded the each first iteration.

20. The system of claim 13, wherein T1 and T2 are a function of only predefined static values for one or more iterations of the first iterations according to Algorithm 1.

* * * * *